(12) United States Patent  (10) Patent No.: US 9,291,659 B2
Ebling  (45) Date of Patent: Mar. 22, 2016

(54) ANTENNA BLOCKAGE DETECTION

(71) Applicant: Ford Global Technologies, LLC, Dearborn, MI (US)

(72) Inventor: James Paul Ebling, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 202 days.

(21) Appl. No.: 14/134,576

(22) Filed: Dec. 19, 2013

(65) Prior Publication Data

US 2015/0177303 A1  Jun. 25, 2015

(51) Int. Cl.
| | |
|---|---|
| *G01R 29/10* | (2006.01) |
| *H01Q 3/26* | (2006.01) |
| *G01S 7/40* | (2006.01) |
| *G01S 13/04* | (2006.01) |
| *G01S 5/02* | (2010.01) |
| *H01Q 1/32* | (2006.01) |
| *G01S 13/34* | (2006.01) |
| *G01S 13/93* | (2006.01) |
| *G01S 7/35* | (2006.01) |
| *G01S 13/58* | (2006.01) |

(52) U.S. Cl.
CPC . *G01R 29/10* (2013.01); *G01S 7/40* (2013.01); *G01S 7/4026* (2013.01); *G01S 13/04* (2013.01); *G01S 13/343* (2013.01); *G01S 13/931* (2013.01); *H01Q 1/3233* (2013.01); *H01Q 3/267* (2013.01); *G01S 13/584* (2013.01); *G01S 2007/356* (2013.01); *G01S 2007/4039* (2013.01)

(58) Field of Classification Search
CPC ......... H01Q 3/26; H01Q 3/267; G01R 29/08; G01R 29/10; G01S 5/021; G01S 7/40; G01S 7/4004; G01S 7/4008; G01S 7/4017; G01S 7/4021; G01S 13/04
USPC ....................... 342/27, 70, 159–174
See application file for complete search history.

(56) References Cited

U.S. PATENT DOCUMENTS

| | | | | | |
|---|---|---|---|---|---|
| 4,870,424 | A | * | 9/1989 | Lalezari | H01Q 3/14 342/159 |
| 4,885,590 | A | * | 12/1989 | Hasan | G01S 13/87 342/160 |
| 4,926,186 | A | * | 5/1990 | Kelly | H01Q 3/267 342/173 |
| 5,929,802 | A | * | 7/1999 | Russell | G01S 7/4008 342/70 |
| 5,959,570 | A | * | 9/1999 | Russell | G01S 7/4004 342/70 |
| 6,469,659 | B1 | * | 10/2002 | Lajiness | G01S 7/4004 342/159 |
| 6,489,927 | B2 | * | 12/2002 | LeBlanc | B60K 31/0008 342/198 |
| 6,611,227 | B1 | * | 8/2003 | Nebiyeloul-Kifle | G01S 7/4004 180/167 |
| 7,205,929 | B2 | | 4/2007 | Shingyoji et al. | |
| 7,342,532 | B1 | * | 3/2008 | Matsuoka | G01S 7/032 342/118 |
| 7,649,490 | B2 | * | 1/2010 | Park | G01S 7/40 318/568.12 |

(Continued)

OTHER PUBLICATIONS

"Near Field Blockage of an Ultralow Sidelobe Antenna", Winchell, Stephen, Daniel Davis, IEEE Transaction on Antennas and Propogation, vol. Ap-28, No. 4, Jul. 1980, pp. 451-459.*

*Primary Examiner* — Peter Bythrow
(74) *Attorney, Agent, or Firm* — Frank MacKenzie; Bejin Bieneman PLC

(57) ABSTRACT

A system includes an antenna having a substrate and a plurality of antenna elements disposed on the substrate. A processing device is configured to measure an aperture function across an aperture of the antenna and determine whether at least one of the antenna elements is blocked based at least in part on the measured aperture function.

20 Claims, 3 Drawing Sheets

(56) References Cited

U.S. PATENT DOCUMENTS

| | | | |
|---|---|---|---|
| 7,728,769 B2 * | 6/2010 | Chang | G01S 7/414 342/360 |
| 7,973,701 B2 * | 7/2011 | Lohmeier | G01S 7/4004 342/104 |
| 8,299,964 B2 * | 10/2012 | Janaswamy | H01Q 3/2605 342/174 |
| 8,441,394 B2 * | 5/2013 | Alland | G01S 7/4026 340/435 |
| 8,558,733 B2 * | 10/2013 | Kamo | G01S 7/295 342/27 |
| 2002/0163463 A1 | 11/2002 | Lajiness et al. | |
| 2004/0257556 A1 | 12/2004 | Samukawa et al. | |
| 2005/0285773 A1 * | 12/2005 | Hartzstein | G01S 7/032 342/70 |
| 2008/0154524 A1 * | 6/2008 | Shirley | G06T 7/0057 702/66 |
| 2009/0243912 A1 | 10/2009 | Lohmeier et al. | |
| 2010/0134344 A1 | 6/2010 | Uesato | |
| 2013/0015999 A1 | 1/2013 | Alland | |

\* cited by examiner

ANTENNA BLOCKAGE DETECTION

BACKGROUND

Autonomous vehicles use technology like radar, lidar, cameras, etc., to "see" the road and vehicle surroundings. Examples of vehicle surroundings include other vehicles, pedestrians, structures such as bridges and buildings, traffic control devices, or the like. Other vehicle surroundings include obstacles such as traffic cones or debris in the lane of travel. The inputs from sensors used for autonomous driving allow the vehicle to navigate with little to no human intervention despite such obstacles.

DETAILED DESCRIPTION

A system includes an antenna having a substrate and a plurality of antenna elements disposed on the substrate. A processing device is configured to measure an aperture function across an aperture of the antenna and determine whether at least one of the antenna elements is blocked based at least in part on the measured aperture function. The system may be implemented in a radar system used in, e.g., a vehicle.

The system shown in the FIGS. may take many different forms and include multiple and/or alternate components and facilities. While an exemplary system is shown, the exemplary components illustrated are not intended to be limiting. Indeed, additional or alternative components and/or implementations may be used.

Figure 1:
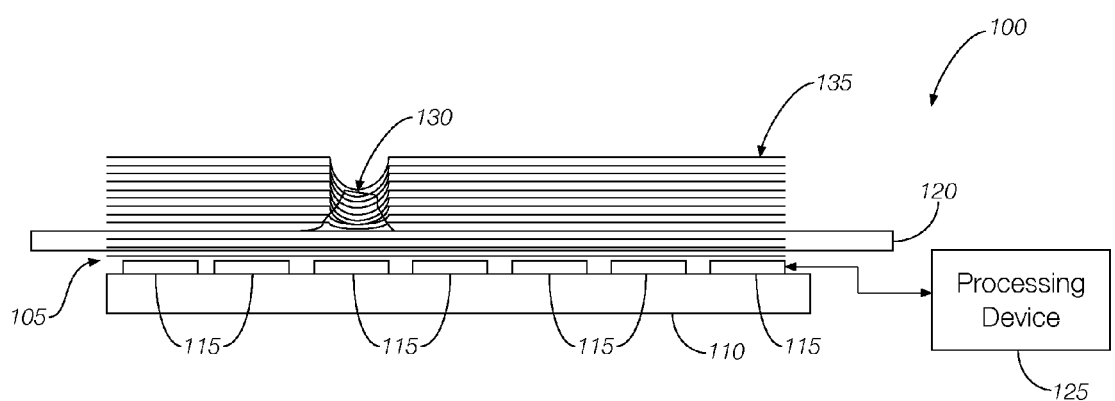
FIG. 1 illustrates an exemplary vehicle system for detecting whether an antenna element is blocked.

As illustrated in FIG. 1, the system 100 includes an antenna 105 with a substrate 110, antenna elements 115, and a radome 120. The system 100 further includes a processing device 125. The system 100 may be implemented in, e.g., any passenger or commercial vehicle such as a car, truck, sport utility vehicle, crossover vehicle, bus, train, airplane, etc.

The antenna 105 may be configured to transmit and/or receive electromagnetic waves, such as radio waves, according to one or more frequencies. When acting as a transmitter, the antenna 105 may generate magnetic and electric fields in accordance with an oscillating current. The magnetic and electric field may oscillate away from the antenna 105 through air and/or space. When acting as a receiver, the antenna 105 may generate an oscillating current representing magnetic and electric fields in the range of the antenna 105. The antenna 105 may be used to implement a vehicle-based radar system, for example.

The substrate 110 may include a dielectric material configured to electrically isolate a conductor, such as the antenna elements 115, from a ground plane (not shown). The substrate 110 may, in some possible approaches, be polarized by applying an electric field. The dielectric constant of the substrate 110 may be based on various factors including the frequency of the signals transmitted and/or received by the antenna 105.

The antenna elements 115 may be disposed on the substrate 110 in, e.g., an array at an aperture of the antenna 105. Each element 115 may be formed from a conductor, such as a metal. The elements 115 may be configured to generate an oscillating magnetic and/or electric field in accordance with an oscillating current. Moreover, the elements 115 may be configured to generate an oscillating current based on magnetic and/or electric fields received. The magnetic and/or electric fields received may be referred to as a "radiation pattern."

The radome 120 may be configured to protect the antenna elements 115 from direct exposure to debris 130 and the elements such as ice, snow, dirt, mud, etc. The radome 120 may be formed from any material that is largely transparent to electromagnetic waves. For example, the radome 120 may be formed from fiberglass, plastic, a polytetrafluoroethylene (PTFE)-coated material, or the like.

The processing device 125 may be configured to measure an aperture function across the aperture (i.e., received by the elements 115). From the measured aperture function, the processing device 125 may determine whether at least one of the antenna elements 115 is obstructed by debris or other blockages 130. Examples of debris 130 may include ice, snow, dirt, mud, or any other material that may collect on the radome 120 over the elements 115 and block signals generated by the elements 115 or otherwise distort a wavefront 135. Thus, the debris 130 may include anything that is not transparent to or would otherwise attenuate an electromagnetic signal such as a radio signal. The processing device 125 may determine that one or more elements 115 are blocked if the phase progression, which may be derived from the aperture function, is non-linear The processing device 125 may determine that one or more elements 115 are blocked if there is a local drop in amplitude or the amplitude function significantly deviates from a desired weighting function. Moreover, the processing device 125 may derive a radiation pattern, having sidelobes, from the aperture function and detect phase non-linearity and amplitude deviations by comparing predicted beam sidelobe levels to actual beam sidelobe levels, as discussed in greater detail with respect to FIGS. 2A-2D, below. Note, however, that some tests of the aperture function do not require that a radiation pattern be expressly generated to assess blockages. For instance, an outlier in the phase progression could be used to predict a blockage, depending on the degree. Similarly, amplitude outliers could be used to predict a blockage. Thus, in some instances, a standard deviation (or variance) of the phase progression from linear (or the amplitude progression from a desired weighting function) could provide a measure or indicator of blockage.

In general, computing systems and/or devices, such as the processing device 125, may employ any of a number of computer operating systems, including, but by no means limited to, versions and/or varieties of the Ford Sync® operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements 115 may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

The antenna 105 may be incorporated into a system 100, such as a radar system that employs pulse-Doppler modulation in which a linear FM pulse is transmitted, typically with a high chirp rate (or slope). In pulse-Doppler modulation, linear frequency modulation (LFM) returns may be received and mixed with the original signal to frequency compress and downconvert the signals to baseband. The compressed signals may be digitized and processed with a Fast Fourier Transform (FFT), Discrete Fourier Transform (DFT), or other appropriate signal processing or filtering techniques to compress the resulting range coded frequencies into individual frequency bins representing range to the object from which the returns were received. This process may be referred to as "fast time" processing in the context of Frequency Modulated Continuous Wave (FMCW) radar systems.

The "fast time" processing operation may be repeated at a rate that is sufficiently high to adequately sample the Doppler spectrum resulting from the expected maximum relative velocity between the host radar and target(s) of interest. The compressed range data may be collected for a number of pulses, and in each range bin, a Fast Fourier Transform operation may be performed over the selected number of pulses to determine the Doppler frequency content, and thus, the velocity content, within each range bin. The number of pulses processed may determine the achievable resolution in the Doppler spectrum. This process may be referred to as "slow time" processing in the context of radar systems.

Prior to performing the Fast Fourier Transform operation, data can be collected in a rectangular matrix and a two-dimensional Fast Fourier Transform operation may be applied to accomplish the range-Doppler processing. Further, it may be possible to restrict the Doppler Fast Fourier Transform operation to particular range bins, such as range bins where the magnitude exceeds the detection threshold indicating the presence of a target. Conversely, assuming adequate signal-to-noise ratio, application of the range Fast Fourier Transform could be restricted to Doppler bins where a target is detected to reduce the amount of processing required by the processing device 125.

With a 2-dimensional data matrix representing the target range in one direction and the target relative closing velocity in the other direction, the process may be carried out for each element 115 (or group of elements 115) in the antenna 105 and the data collected. A largely linear phase progression in a particular range-Doppler bin across the elements 115 in the array in a particular dimension has a slope that is proportional to the angle off of broadside for a target detected in that bin.

The linear phase proportionality to angular offset may suggest that the angle is proportional to frequency and by performing a Fast Fourier Transform in the element 115 direction, for each range-Doppler bin, the angular direction of a target or targets in any of the range-Doppler bins is located as the frequency-coded angle may be compressed into the appropriate Fast Fourier Transform frequency bin. The raw data may be collected first, which may result in a 3-dimensional "data cube" in which the processing can be applied as a 3-D Fast Fourier Transform, or in any other order since the processes are linear.

Alternatively, other forms of processing, such as Capon's method, can be applied across the elements 115 of the antenna 105 where phase and amplitude weighting are applied in the element direction to form one or multiple beams with nulling and sidelobe control. Also, super resolution techniques may be applied to the angle estimation through processes such as MUSIC, ESPRIT, or Maximum Likelihood.

Radar systems may suffer from transmit energy leaking into the receiver, sometimes resulting from reflections due to an imperfect match between the transmit antenna 105 and the feed line, or from the radome 120, or other close by objects (i.e., the metal bumper, or plastic bumper fascia in automobiles). Thus, there may be a strong leakage signal in the zero range, zero Doppler bin for each element 115. The phase of this signal across the elements 115 may be expected to have a measurable (e.g., not necessarily exactly linear, but can be calibrated) trend that can be measured in a condition of no blockage 130. In the case where there is a partial blockage 130 that would result in elevated sidelobe levels in the antenna 105 beams formed by the processing, a non-linearity in the phase progression across the elements 115 may be expected. Indeed, outliers in the phase progression may indicate which elements 115 are being affected. By testing how close the zero-range, zero-Doppler bin in the processed data cube is to the calibration progression, partial blockage 130 of the antenna 105 can be discerned.

An amplitude difference in the zero-range, zero-Doppler bin may be expected due to increased reflection from the dielectric discontinuity caused by the blockage 130. Even though less pronounced than the phase error, this amplitude difference may possibly be used to increase the confidence of the phase-based measure. The amplitude may be readily measured for the zero-range, zero-Doppler bin at each element 115 (or group of elements 115) in a digital beamforming based antenna system 100, just as with the phase. Thus the complex aperture function is measured.

This process for detecting blockages 130 is scene independent. Targets in the scene will typically be farther away than zero-range, and if they are that close, declaring a blockage condition would be acceptable in that the target itself would be forming the blockage 130 (although, in this case, the blockage 130 is more likely to present a more constant phase progression unless the target is small relative to the antenna 105 aperture). Further, the process should allow detection of partial blockage 130 after processing of a single sequence of pulses is completed, or at least after a very few sequences, thus making it faster than other methods. Even in a situation where the radar is operated during an extended period where there are no targets present in the field of view, a partial blockage 130 can be readily detected very quickly.

More advanced methods of tracking the phase across the elements 115 could also be employed to reduce false positives if necessary. Advanced methods may include observing a long-term standard deviation of the phase difference from linear and testing to determine whether it exceeds a predetermined, or adaptive, threshold.

FIGS. 2A-2D illustrate examples of radiation patterns that indicate whether or not one or more elements 115 are blocked by debris 130. The distortion from partial or complete blockages 130 may generally present itself as relatively high or unexpected beam sidelobe levels, or in some instances, a main beam split into two or more beams. The distortion may reduce the detection range of a radar system since more energy is going to the sidelobes or being split between multiple main beams. Moreover, the distortion may cause erroneous angle measurement for targets that are detected because detections become more probable in elevated sidelobe regions, thus possibly suggesting a detection in a sidelobe where no target exists in the main beam. Also, a split main beam may effectively form two or more large sidelobes at erroneous angles relative to the expected main beam and a target in either could be detected and its angle would be reported as the desired main beam direction rather than the split beam direction.

Figure 2A:
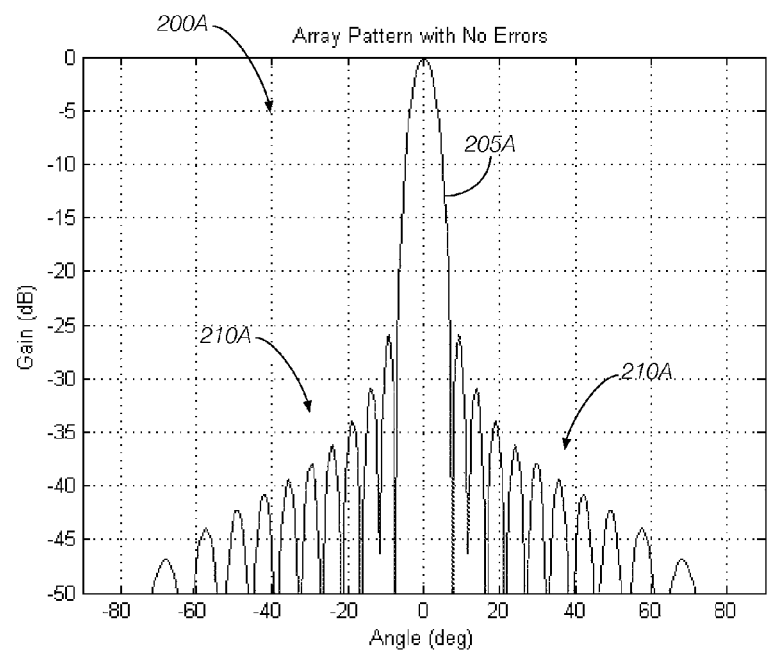
FIG. 2A is a graph of an exemplary antenna pattern with no blockages.
Figure 2B:
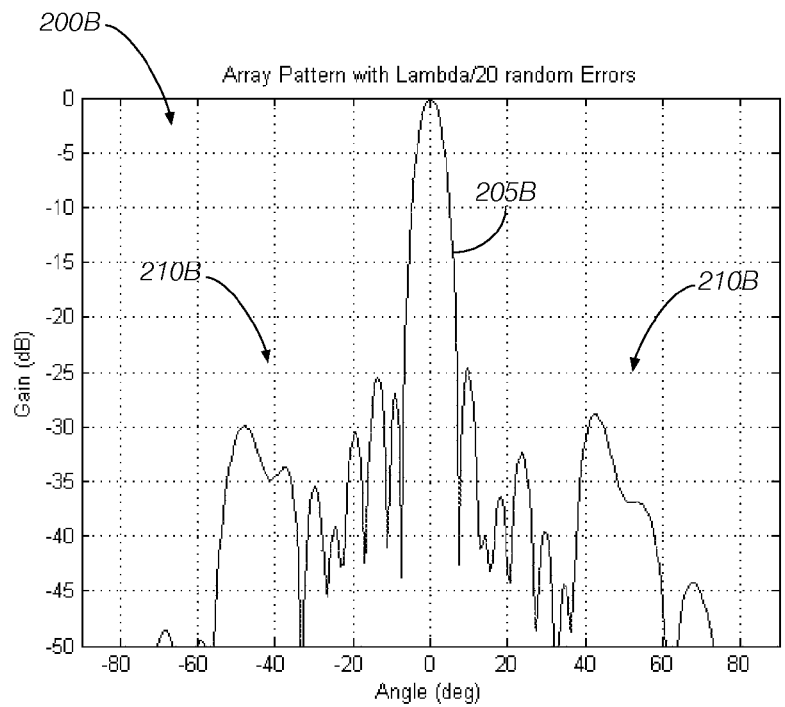
FIG. 2B is a graph of another exemplary antenna pattern with no blockages.
Figure 2C:
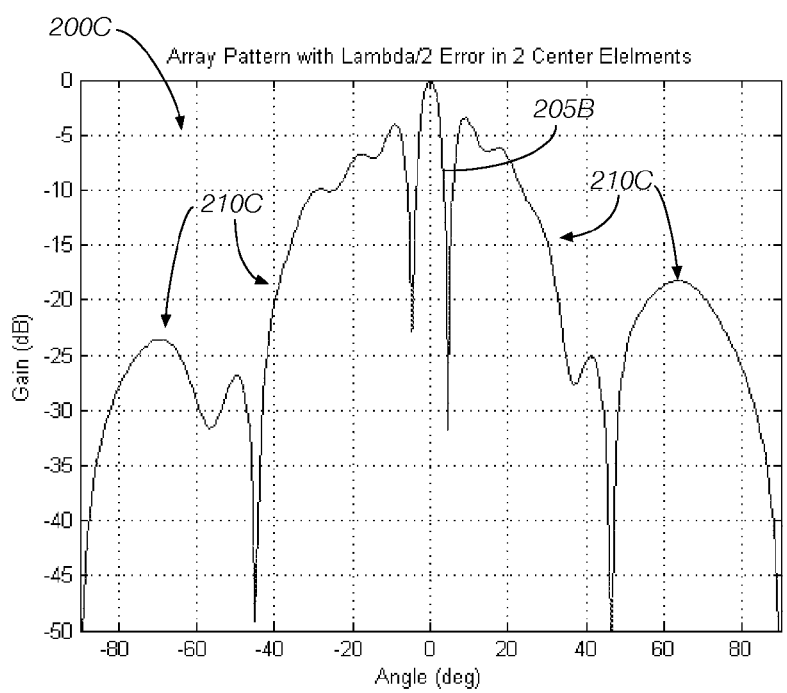
FIG. 2C is a graph of an exemplary antenna pattern where some of the elements are blocked.
Figure 2D:
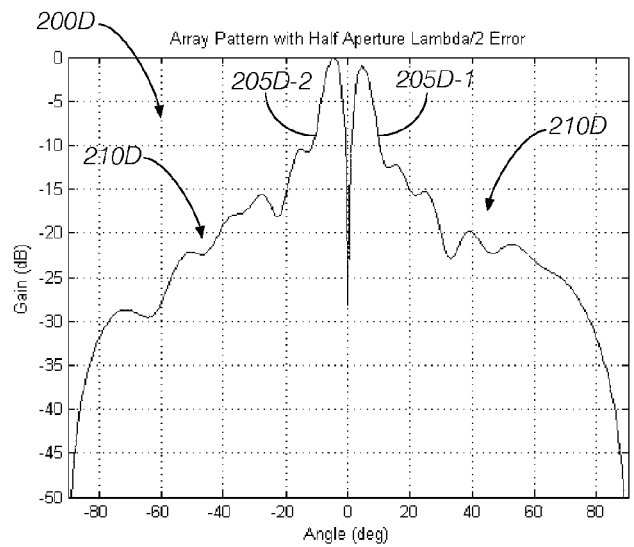
FIG. 2D is a graph of another exemplary antenna pattern where some of the antenna elements are blocked.

FIG. 2A represents a radiation pattern 200A, which may be derived from the aperture function, with no errors detected. The radiation pattern 200A of FIG. 2A results from an aperture function that follows an expected linear phase progression. A main beam 205A is surrounded by sidelobes 210A that consistently attenuate as the angle from the main beam 205A increases. FIG. 2B shows an example radiation pattern from an aperture function with random phase errors that may occur during actual implementations of the system 100. In the example of FIG. 2B, a main beam 205B is present but the sidelobes 210B do not attenuate consistently as the angle from the main beam 205B increases. Nevertheless, the sidelobes 210B may be predicted to attenuate in such a way that this level of random error could be considered to be a largely linear progression. Therefore, the sidelobes 210B shown in FIG. 2B may be adequate for blockage detection purposes. In other words, the radiation pattern shown in FIG. 2B may illustrate an imperfect, yet acceptable, implementation. FIG. 2C illustrates an example of a radiation pattern 200C with a partial blockage 130, and in particular, a blockage 130 over two center elements 115. In the radiation pattern 200C of FIG. 2C, the main beam 205C is surrounded by sidelobes 210C that are heavily distorted and do not attenuate as expected. Thus, the radiation pattern 200C follows from an aperture function with non-linear phase progression and an irregular amplitude progression. FIG. 2D illustrates an example of a radiation pattern 200D where the elements 115 on approximately one half of the array are blocked. The main beam 205D has been split into two main beams 205D-1 and 205D-2. The amplitudes of the sidelobes are also irregular, further indicating that the radiation pattern 200D follows from an aperture function with non-linear phase progression.

Figure 3:
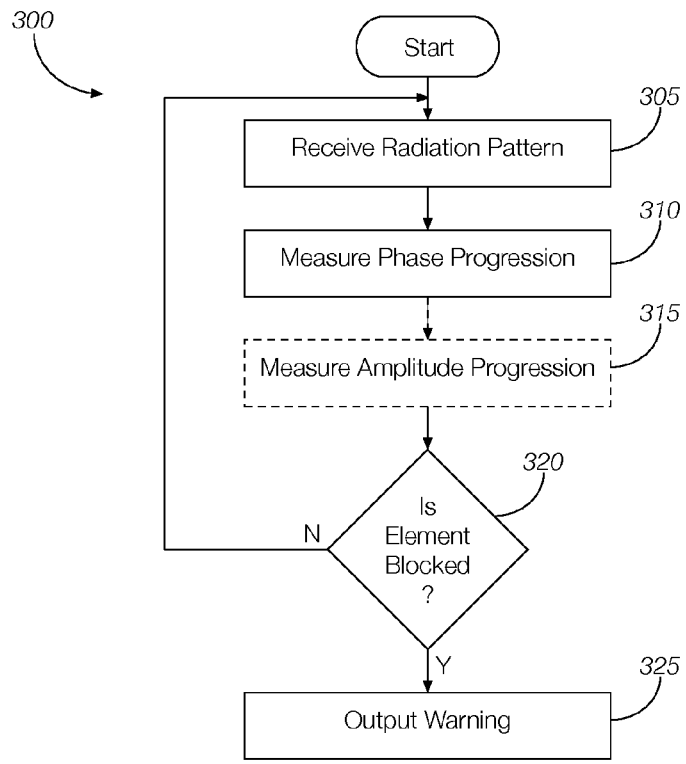
FIG. 3 is a flowchart of an exemplary process that may be used to detect whether an antenna element is blocked.

FIG. 3 is a flowchart of an exemplary process 300 that may be implemented by one or more components of the system 100 of FIG. 1, such as the processing device 125.

At decision block 305, the processing device 125 may measure the aperture function. The aperture function may be measured from a radio frequency signal received by the antenna 105, and in particular, the elements 115 of the antenna 105. The aperture function may be detected at a location near the elements 115 to determine whether the aperture function has been disrupted by debris 130 on one or more elements 115. The aperture function may be made up of a phase progression and an amplitude progression. A radiation pattern may be generated or derived from the aperture function. Thus, a distortion of the aperture function may be presented as a distorted radiation pattern.

At block 310, the processing device 125 may derive a phase progression of the aperture function across the aperture. This phase progression may be used to derive a radiation pattern having a main beam(s) and sidelobes. An irregular or non-linear phase progression may result in a radiation pattern with a main beam and/or sidelobes that are different than expected.

At block 315, the processing device 125 may derive an amplitude progression of the aperture function across the aperture. This amplitude progression may also be used to derive the radiation pattern. An irregular or non-standard amplitude progression may result in a radiation pattern with a main beam and/or sidelobes that are different than expected. In some implementations, block 315 may be omitted.

At decision block 320, the processing device 125 may determine whether an element 115 in the antenna 105 is blocked by debris 130 that is transparent to or otherwise attenuates electromagnetic signals such as radio signals. The processing device 125 may determine that an element 115 is blocked by debris 130 if the sidelobe levels of the derived radiation pattern are significantly different from predicted sidelobe levels. Thus, determining whether an element 115 is blocked by debris 130 may include predicting the sidelobe levels in the derived radiation pattern and comparing the predicted sidelobe levels to actual sidelobe levels. If it is determined that an element 115 is blocked, the process 300 may continue at block 325. If no elements 115 are determined to be blocked, the process 300 may return to block 305.

At block 325, a warning or other type of notification may be presented to, e.g., a driver of the vehicle indicating that the radar system may be unreliable due to the blockage 130. Thus, the radar system and any system that depends upon the radar system such as an autonomous driving system may become disabled until the debris 130 is cleared. The debris 130 may be cleared with or without human intervention. For instance, rain could wash away dirt or mud that has collected on the radome 120, and ice that collects on the antenna 105 may melt on its own. Alternatively, the debris 130 may be cleared by someone such as a driver of the vehicle.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A system comprising:
    an antenna having a substrate and a plurality of antenna elements disposed on the substrate;
    a processing device programmed to measure an aperture function across an aperture of the antenna, the aperture function including velocity data, angular offset data, and range data arranged in a data cube, and determine whether at least one of the antenna elements is blocked based at least in part on the measured aperture function based at least in part on a Fourier Transform technique to the data in the data cube.

2. The system of claim 1, wherein the processing device is programmed to determine that at least one antenna element is blocked if a radiation pattern derived from the measured aperture function is distorted.

3. The system of claim 1, wherein the processing device is programmed to derive a radiation pattern from the measured aperture function, the radiation pattern having sidelobes.

4. The system of claim 3, wherein the processing device is programmed to determine whether at least one antenna element is blocked based on the sidelobe levels of the derived radiation pattern.

5. The system of claim 1, wherein the aperture function is based at least in part on a phase progression and an amplitude progression across the aperture of the antenna.

6. The system of claim 5, wherein the processing device is programmed to determine whether at least one antenna element is blocked based at least in part on at least one of the phase progression and the amplitude progression.

7. The system of claim 1, wherein the processing device is programmed to derive a radiation pattern from the measured aperture function, the radiation pattern having sidelobes, and wherein the processing device is further programmed to predict expected sidelobe levels.

8. The system of claim 7, wherein the processing device is programmed to determine whether at least one antenna element is blocked by comparing the sidelobes of the radiation pattern to the expected sidelobe levels.

9. The system of claim 1, wherein the antenna is configured to generate and receive radio frequency signals.

10. A method comprising:
    measuring an aperture function across an aperture of an antenna, the aperture function including velocity data, angular offset data, and range data arranged in a data cube; and
    determining whether at least one antenna element is blocked based at least in part on the measured aperture function based at least in part on a Fourier Transform technique applied to the data in the data cube.

11. The method of claim 10, wherein determining whether at least one antenna element is blocked includes determining whether one or more of a measured phase progression and a measured amplitude progression is non-linear or substantially deviates from an expected progression.

12. The method of claim 10, wherein determining whether at least one antenna element is blocked includes:
    deriving a radiation pattern from the aperture function;
    predicting a beam sidelobe level in the derived radiation pattern; and
    comparing the predicted beam sidelobe level to an actual sidelobe level.

13. The method of claim 12, wherein determining whether at least one antenna element is blocked is based at least in part on the predicted beam sidelobe level.

14. The method of claim 10, wherein determining whether at least one antenna element is blocked is based at least in part on at least one of a phase progression and an amplitude progression determined from the aperture function.

15. The method of claim 10, wherein the aperture function is based on a radio frequency signal received by the antenna.

16. A vehicle system comprising:
    an antenna having a substrate and a plurality of antenna elements disposed on the substrate;

a processing device programmed to measure an aperture function, the aperture function including velocity data, angular offset data, and range data arranged in a data cube, wherein the processing device is programmed to derive a phase progression and an amplitude progression from the aperture function, predict sidelobe levels from at least one of the phase progression and the amplitude progression, and determine whether at least one of the antenna elements is blocked based at least in part on a Fourier Transform technique to the data in the data cube and if the predicted sidelobe levels are substantially different from actual sidelobe levels.

17. The vehicle system of claim 16, wherein the processing device is programmed to determine that at least one antenna element is blocked if at least one of the phase progression and the amplitude progression is non-linear or substantially deviates from an expected progression.

18. The vehicle system of claim 16, wherein the processing device is programmed to derive a radiation pattern from the measured aperture function, the radiation pattern having sidelobes.

19. The vehicle system of claim 16, wherein the processing device is programmed to compare the actual sidelobe levels to the predicted sidelobe levels.

20. The vehicle system of claim 16, wherein the antenna is configured to generate and receive radio frequency signals.

* * * * *